(12) United States Patent
Dawson et al.

(10) Patent No.: US 12,012,328 B2
(45) Date of Patent: Jun. 18, 2024

(54) STRESS ISOLATED DEVICE PACKAGE AND METHOD OF MANUFACTURE

(71) Applicant: NXP USA, Inc., Austin, TX (US)

(72) Inventors: Chad Dawson, Queen Creek, AZ (US); Mark Edward Schlarmann, Chandler, AZ (US); Stephen Ryan Hooper, Mesa, AZ (US); Colin Bryant Stevens, Austin, TX (US)

(73) Assignee: NXP USA, Inc., Austin, TX (US)

( * ) Notice: Subject to any disclaimer, the term of this patent is extended or adjusted under 35 U.S.C. 154(b) by 388 days.

(21) Appl. No.: 17/246,986

(22) Filed: May 3, 2021

(65) Prior Publication Data

US 2022/0348456 A1 Nov. 3, 2022

(51) Int. Cl.
 *B81B 7/00* (2006.01)
 *B81C 1/00* (2006.01)

(52) U.S. Cl.
 CPC ........ *B81B 7/0058* (2013.01); *B81C 1/00325* (2013.01); *B81B 2201/0264* (2013.01); *B81B 2207/07* (2013.01)

(58) Field of Classification Search
 CPC ................ B81B 7/0045–0054; B81C 1/00325
 See application file for complete search history.

(56) References Cited

U.S. PATENT DOCUMENTS

| | | | |
|---|---|---|---|
| 9,446,940 B2 | 9/2016 | Dawson et al. | |
| 9,458,008 B1 | 10/2016 | Dawson et al. | |
| 9,790,089 B2 | 10/2017 | Dawson et al. | |
| 10,060,820 B2 | 8/2018 | Chen et al. | |
| 10,611,628 B2 | 4/2020 | Lee et al. | |
| 2012/0175747 A1 | 7/2012 | Schlarmann et al. | |
| 2013/0214365 A1* | 8/2013 | Schlarmann | B81B 3/0021 257/E29.323 |
| 2014/0353772 A1* | 12/2014 | Stermer, Jr. | B81C 1/00325 438/51 |
| 2016/0159642 A1 | 6/2016 | Hooper et al. | |
| 2017/0001857 A1* | 1/2017 | Jeong | B81B 7/0048 |
| 2017/0081179 A1* | 3/2017 | Dawson | B81B 7/0061 |
| 2019/0161345 A1 | 5/2019 | Brandl et al. | |
| 2019/0300362 A1* | 10/2019 | Brandl | B81B 7/0025 |

FOREIGN PATENT DOCUMENTS

| DE | 102010043982 A1 | 12/2011 |
|---|---|---|
| EP | 1860061 B1 | 3/2011 |

OTHER PUBLICATIONS

U.S. Appl. No. 16/744,577; not yet published; 22 pages, filed Jan. 16, 2020.

* cited by examiner

*Primary Examiner* — Benjamin P Sandvik (57) ABSTRACT

A device package includes a die that includes a substrate having first and second surfaces. A sensor is formed at a sensor region of the first surface. A trench extends entirely through the substrate between the first and second surfaces, in which the trench at least partially surrounds the sensor region. An isolation material, formed at the first surface, may extend across the trench A ring structure is coupled to the first surface of the substrate to create a first cavity in which the sensor is contained, the ring structure being laterally displaced away from and surrounding the sensor region and the trench. A molded compound body may abut an outer wall of the ring structure. The molded compound body has a second cavity that is concentric with the first cavity to enable fluid communication between the sensor and an environment external to the device package.

16 Claims, 7 Drawing Sheets

STRESS ISOLATED DEVICE PACKAGE AND METHOD OF MANUFACTURE

TECHNICAL FIELD OF THE INVENTION

The present invention relates generally to microelectromechanical systems (MEMS) device packages. More specifically, the present invention relates to stress isolated MEMS device packages, such as pressure sensor packages.

BACKGROUND OF THE INVENTION

Microelectromechanical system (MEMS) devices are semiconductor devices with embedded mechanical components. MEMS devices include, for example, pressure sensors, accelerometers, gyroscopes, microphones, digital mirror displays, micro fluidic devices, and so forth. MEMS devices, including pressure sensor devices, can be used in a wide range of applications. There are significant challenges in the packaging of pressure sensors due at least in part to the necessity for the pressure sensors to interact with the outside environment, the fragility of many types of pressure sensors, and severe cost constraints. Indeed, many pressure sensor device applications require smaller size and low cost packaging to meet aggressive cost targets.

SUMMARY

Aspects of the disclosure are defined in the accompanying claims.

In a first aspect, there is provided a package comprising a die that includes a substrate having a first surface and a second surface, a sensor formed at a sensor region of the first surface, and a trench extending entirely through the substrate between the first and second surfaces, the trench at least partially surrounding the sensor region; and a ring structure coupled to the first surface of the substrate to create a first cavity in which the sensor is contained, the ring structure being laterally displaced away from and surrounding the sensor region and the trench.

In a second aspect, there is provided a method of forming a packaged device comprising forming a trench extending entirely through a substrate of a first die, the trench extending between first and second surface of the substrate, the trench at least partially surrounding a sensor region of the first die, wherein a sensor is formed at the first surface of the substrate at the sensor region; and forming a ring structure at the first surface of the substrate to create a first cavity in which the sensor is contained, the ring structure being laterally displaced away from and surrounding the sensor region and the trench.

In a third aspect, there is provided a package comprising a die that includes a substrate having a first surface and a second surface, a pressure sensor formed at a sensor region of the first surface, a trench extending entirely through the substrate between the first and second surfaces, the trench at least partially surrounding the sensor region, and a backside cavity extending into the substrate from the second surface at a location that is aligned with the trench and the sensor region, the backside cavity having a depth that is less than a thickness of the substrate between the first and second surfaces; a ring structure coupled to the first surface of the substrate to create a first cavity in which the sensor is contained, the ring structure being laterally displaced away from and surrounding the sensor region and the trench; and a molded compound body comprising a second cavity that is concentric with the first cavity to enable fluid communication between the pressure sensor and an environment external to the package.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns microelectromechanical systems (MEMS) device packages and methodology for manufacturing such device packages. More particularly, stress isolation is built into a MEMS die to enable smaller packages and a more standard packaging methodology. The stress isolation is achieved by a trench built into a MEMS sensor die (such as a pressure sensor die) and surrounding a sensor region of the die that isolates a sensor at the sensor region from lateral package stress. Additionally, a shallow backside cavity provides clearance between the sensor region and an attached application specific integrated circuit (ASIC) to ensure vertical stress isolation. A standoff (referred to herein as a ring structure) surrounds the trench and the sensor region to allow a mold tool to seal directly to the top of the MEMS die to enable an overmolded package. The overmolded package provides for encapsulation of the bond wires to reduce the potential for changes in bond wire parasitic capacitance. For some applications, a no-gel sensor configuration is possible or a soft gel can be used for media compatibility, thereby enabling a wide application range. Still further, the manufacturing methodology may enable means for integrating sensor devices, such as pressure sensors, into fanout wafer level chip scale packages (WLCSPs). The manufacturing methodology may therefore result in reduced cost, reduced size of the packaged devices, improved reliability and accuracy of the packaged devices, and provide a pathway to ongoing technology enhancements. The present disclosure will be described with reference to a MEMS pressure sensor die, it being understood the present disclosure should not be limited thereto.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, the figures may be illustrated using various shading and/or hatching to distinguish the various elements within the structures.

Figure 1:
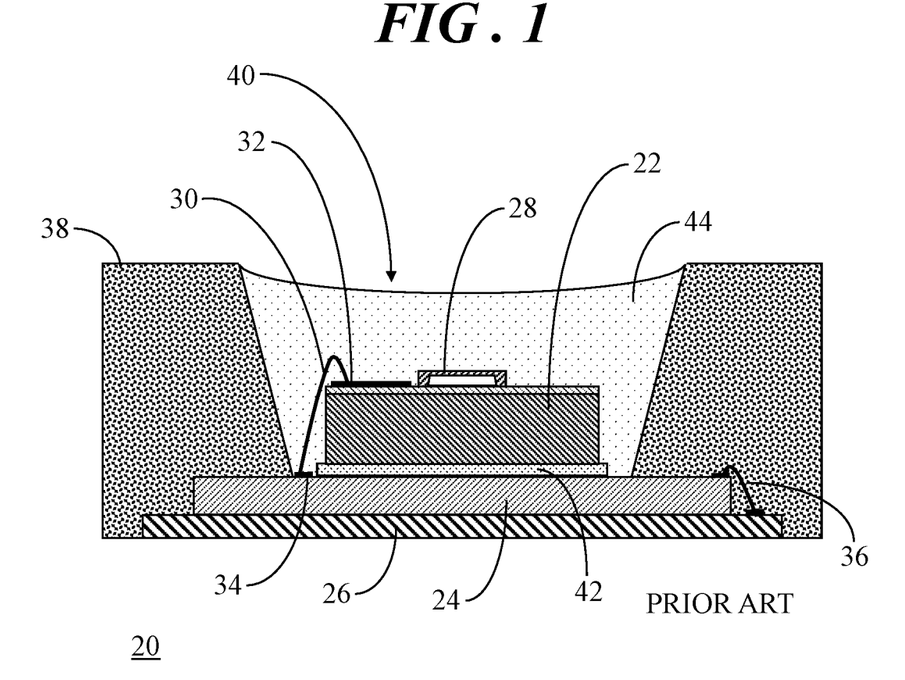
FIG. 1 shows a side sectional view of a prior art microelectromechanical systems (MEMS) packaged device.

Referring to FIG. 1, FIG. 1 shows a side sectional view of a prior art microelectromechanical systems (MEMS) packaged device 20 which may be, for example, a packaged pressure sensor. Packaged pressure sensor 20 includes a sensor die 22 coupled to an application specific integrated circuit (ASIC) die 24 which, in turn is coupled to a lead frame 26. Sensor die 22 may have a sensor, such as a pressure sensor 28, formed thereon. Bond wires 30 (one shown) are interconnected between bond pads 32 on sensor die 22 and bond pads 34 (one shown) on ASIC die 24. Further, bond wires 36 (one shown) may be interconnected between ASIC die 24 and lead frame 26. A molded compound body 38 partially encapsulates ASIC die 24 and lead frame 26.

Typical manufacturing processes for pressure sensor packages (e.g., packaged pressure sensor 20) involves placing a pressure sensor in a cavity-type package made of non-conductive material so that the pressure sensor can be in fluid communication with an external environment. Thus, as shown in FIG. 1, sensor die 22, having pressure sensor 28, is placed in a cavity 40 formed in molded compound body 38. Cavity 40 is typically substantially larger than sensor die 22, often dictating overall package size. Additionally, a soft die attach material 42 may be used to couple sensor die 22 to ASIC die 24 to isolate sensor die 22 from package stress. Unfortunately, this soft die attach material 42 can be undesirably costly. Further, a silicone gel 44 may be placed in cavity 40 to protect the components (e.g., pressure sensor 28 and/or bond wires 30) from exposure to moisture and other elements of the environment. Unfortunately, a significant amount of gel 44 may needed in cavity 120 and gel 44 is relatively costly. Further, bond wires 30 pass through gel 44, making them susceptible to changes in parasitic capacitance which reduces the reliability and accuracy of pressure sensor 28. Another costly step in the manufacture of packaged pressure sensors is the use of films in film-assisted molding of the package in some processes. Once used, the film cannot be used again. Embodiments described below build stress isolation into the sensor die, enabling a more standard packaging process. The result may be reduced cost, reduced size, and improved reliability and accuracy of packaged pressure sensors.

Figure 2:
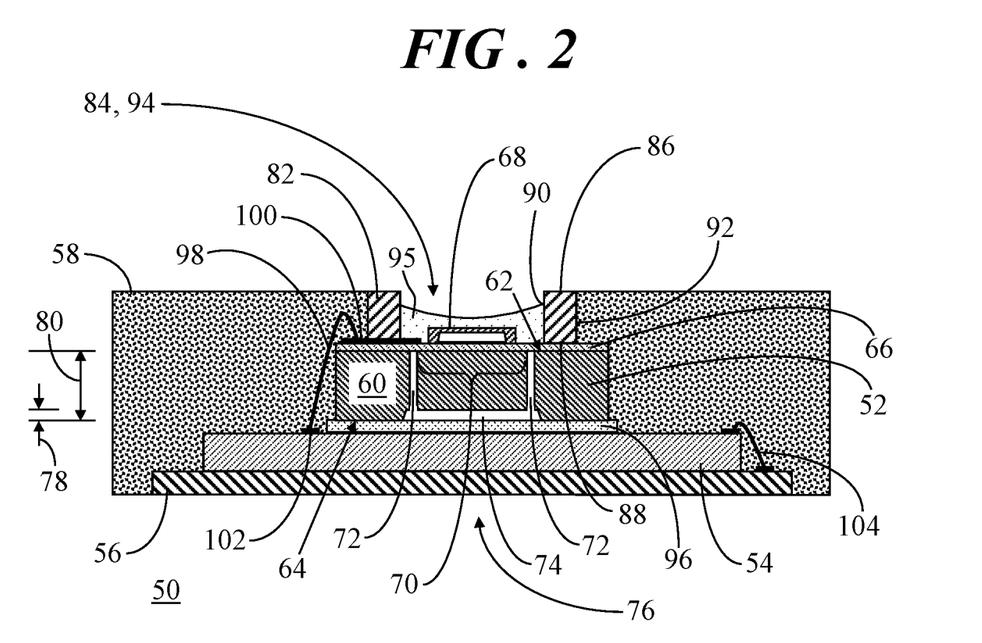
FIG. 2 shows a side sectional view of a MEMS packaged device in accordance with an embodiment.

FIG. 2 shows a side sectional view of a MEMS packaged device 50 in accordance with an embodiment. Packaged device 50 may be, for example, a packaged pressure sensor device. Packaged pressure sensor device 50 includes a first die, referred to herein as a sensor die 52, a second die, referred to herein as an ASIC die 54, and a lead frame 56 all of which are at least partially encapsulated in a molded compound body 58.

Sensor die 52 includes a substrate 60 having a first surface 62 and a second surface 64. In the illustrated embodiment, an isolation material 66 (such as an oxide, polysilicon, and/or nitride) is formed on first surface 62. A sensor, such as a pressure sensor 68, is formed on isolation material 66 at a sensor region 70 of first surface 62. A trench 72 extends entirely through substrate 60 between first and second surfaces 62, 64, with trench 72 at least partially surrounding sensor region 70. In some embodiments, isolation material 66, formed at first surface 62, extends over trench 72. A backside cavity 74 extends into substrate 60 from second surface 64 at a location 76 that is vertically aligned with sensor region 70 and trench 72. Backside cavity 74 has a depth 78 that is less than a thickness 80 of substrate 60 between first and second surfaces 62, 64. In general, trench 72 surrounding sensor region 70 of sensor die 52 isolates sensor 68 from lateral package stress and backside cavity 74 provides clearance between sensor region 70 of sensor die 52 and the underlying ASIC die 54 to ensure vertical stress isolation.

A ring structure 82 is coupled to first surface 62 of substrate 60. In some embodiments, isolation material 66 may be interposed between ring structure 82 and first surface 62 of substrate 60. In other embodiments, ring structure 82 may be directly coupled to first surface of substrate 60. Ring structure 82 is coupled to first surface 62 of substrate 60 to create a first cavity 84 in which sensor 68 is contained. Ring structure 82 is laterally displaced away from and surrounds sensor region 70 and trench 72. Ring structure 82 may be, for example, a thick-film, flexible, conductive or non-conductive polymer ring. Ring structure 82 may be square-shaped and may be approximately two hundred microns thick. In other embodiments, ring structure 82 may take the form of a circular-shaped structure and/or may be a different thickness.

Ring structure 82 has a first flat surface 86 and an oppositely facing second flat surface 88 that contacts isolation material 66 at first surface 62 of substrate 60 in the illustrated embodiment. In other embodiments, second flat surface 88 of ring structure 82 may directly contact first surface 62 of substrate 60 when isolation material 66 is not present at first surface 62. Additionally, ring structure 82 has an inner wall 90 and an outer wall 92 extending between the oppositely facing first and second flat surfaces 86, 88. Inner wall 90 circumscribes trench 72 and sensor region 70 and molded compound body 58 abuts outer wall 92. As will be discussed in greater detail below, a seal is formed between second flat surface 88 and substrate 60 to inhibit a flow of molding compound into first cavity 84 during an encapsulation process in which molded compound body 58 is formed. Following the encapsulation process, molded compound body 58 has a second cavity 94 that is concentric with (e.g., shares the same center as) first cavity 84 to enable fluid communication between sensor 68 and an environment external to packaged pressure sensor device 50. In some embodiments, a gel material 95 may be placed in cavity 84 to protect sensor 68 from exposure to moisture and other elements of the environment. Other embodiments may entail a no-gel option in which gel material 95 is absent from cavity 84.

ASIC die 54 is coupled to second surface 64 of sensor die 60 using, for example, a suitable die attach material 96. One or more bond wires 98 (one shown) are interconnected between a corresponding one or more first bond pads 100 (one shown) located at first surface 62 of sensor die 52 and a corresponding one or more second bond pads 102 (one shown) on ASIC die 54. First bond pad 100 is located at first surface 62 outside of an outer periphery (e.g., outside of the region delineated by outer wall 92) of ring structure 82. Further, one or more bond wires 104 (one shown) are interconnected between ASIC die 54 and lead frame 56. Molded compound body 58 encapsulates bond wires 98, 104. Unlike prior art configurations such as that shown in FIG. 1, the encapsulation of bond wires 98 extending between sensor die 52 and ASIC die 54 may reduce the potential for changes to bond wire parasitic capacitance for improved sensor reliability and accuracy.

Figure 3:
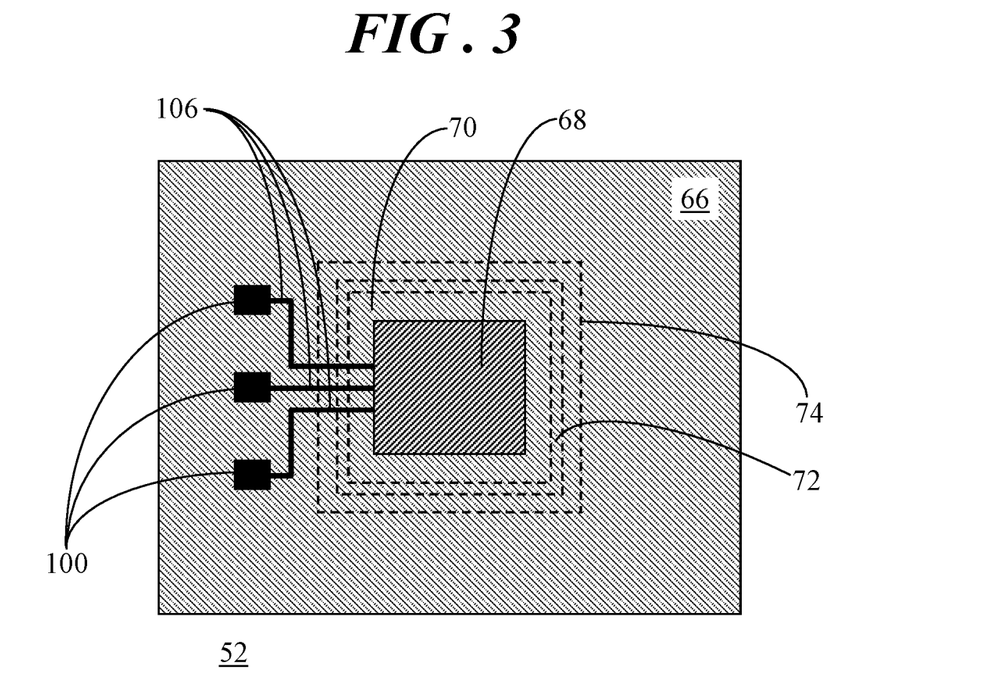
FIG. 3 shows a top view of a sensor die of the packaged device of FIG. 2.

Referring to FIGS. 2 and 3, FIG. 3 shows a top view of sensor die 52 of packaged device 50 (FIG. 2). In this example illustration, ring structure 82 and molded compound body 58 are not shown in order to visualize trench 72 surrounding sensor region 70, and an outer boundary of backside cavity 74. In the illustrated configuration, isolation material 66 covers first surface 62 of substrate 60 and extends over trench 72. Backside cavity 74 extends from second surface 64 only partially into substrate 60. Thus, both trench 72 and the outer boundary of backside cavity 74 are hidden in the top view of FIG. 3 and are therefore represented by dashed lines.

In this example, isolation material 66 may be a thin sheet of oxide, polysilicon, and/or nitride for providing stress isolation. During a manufacturing process, isolation material 66 spanning trench may prevent contaminants, such as saw slurry, from entering trench 72. Further, conventional photoresist deposition and removal may be utilized at assembly. In some embodiments, such as that shown in FIG. 3, trench 72 may fully surround or encircle sensor region 70. Electrically conductive traces 106 are formed on isolation material 66 and therefore span across trench 72 to electrically interconnect sensor 68 with first bond pads 100.

Figure 4:
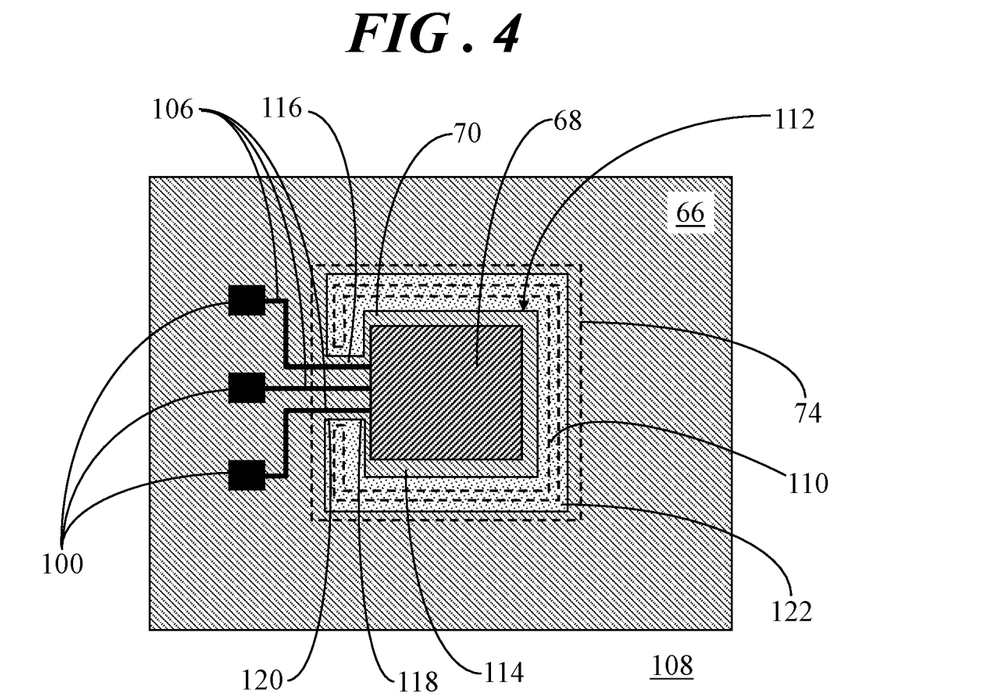
FIG. 4 shows a top view of a sensor die for a packaged device in accordance with another embodiment.

FIG. 4 shows a top view of a sensor die 108 for a packaged device (e.g., packaged device 50) in accordance with another embodiment. Sensor die 108 includes features similar to those described above in connection with sensor die 52. Thus, shared features will be designated by the same reference numbers. Again, ring structure 82 and molded compound body 58 are not shown in this example illustration to better visualize the underlying features. Accordingly, sensor die 108 includes sensor 68 formed at sensor region 70, backside cavity 74, and isolation material 66. First bond pads 100 and electrically conductive traces 106 are formed on isolation material 66.

In accordance with the illustrated embodiment, sensor die 108 includes a trench 110 that partially surrounds sensor region 70 to form a cantilevered platform structure 112 having a platform 114 and an arm 116 having first and second ends 118, 120. First end 118 of arm 116 extends from platform 114 and second end 120 extends from substrate 60 bordering trench 110. Sensor 68 is located on platform 114. In the configuration of FIG. 4, sufficient lateral stress isolation may be provided by trench 110 fully extending along three sides of sensor region 70 (e.g., platform 114) and trench 110 extending as far as possible along the fourth side of sensor region 70. For example, on the fourth side of sensor region 70 at which arm 116 is located, trench 110 may extend at least fifty percent of the length of the fourth side of sensor region 70 to yield effective lateral stress isolation while providing sufficient structure (e.g., arm 116) for the placement of electrically conductive traces 106.

Figure 8:
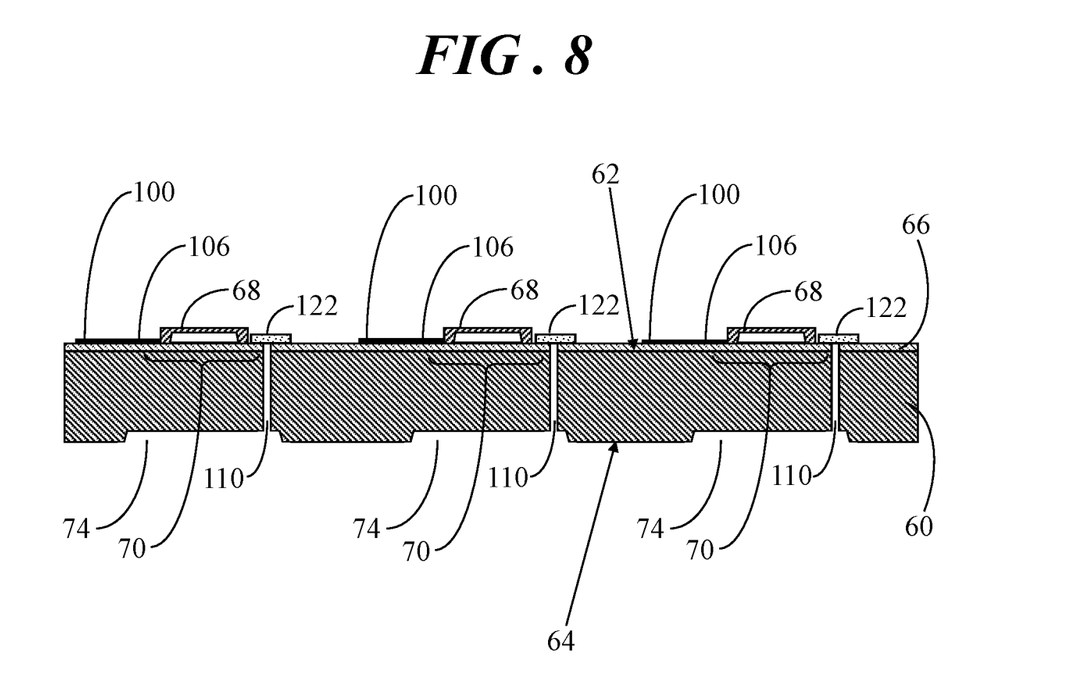
FIG. 8 shows a side view of the structure of FIG. 6 at a subsequent phase of manufacturing to produce the sensor die of FIG. 4.

In the illustrated example, and as shown in FIG. 8, trench 110 extends through substrate 60 (see FIG. 8) and isolation material 66. A second isolation material 122 is formed over isolation material 66 at the region immediately surrounding trench 110 and extends over trench 110. As discussed previously, isolation material 66 may be a sheet of oxide, polysilicon, and/or nitride. In some embodiments, isolation material 122 may be a polyimide material covering trench 110. A polyimide material has a lower modulus of elasticity than the oxide, polysilicon, and/or nitride materials. Thus, a polyimide material may be less stiff to yield enhanced lateral stress isolation relative to the oxide, polysilicon, and/or nitride materials. In other words, a material having a higher modulus of elasticity may more readily transmit the stress from the package than a material having a lower modulus of elasticity. However, due to their greater stiffness, oxide, polysilicon, and/or nitride materials may provide better resistance against rapid decompression events that might otherwise damage sensor 68 (e.g., cause cracking of the fragile diaphragm of a pressure sensor). Accordingly, the selection of isolation material extending over either of trench 72 (FIG. 3) and/or trench 110 may be determined based at least in part on an operational environment of a packaged device (e.g., packaged device 50, FIG. 3) that includes either of sensor die 52 or sensor die 108.

Figure 5:
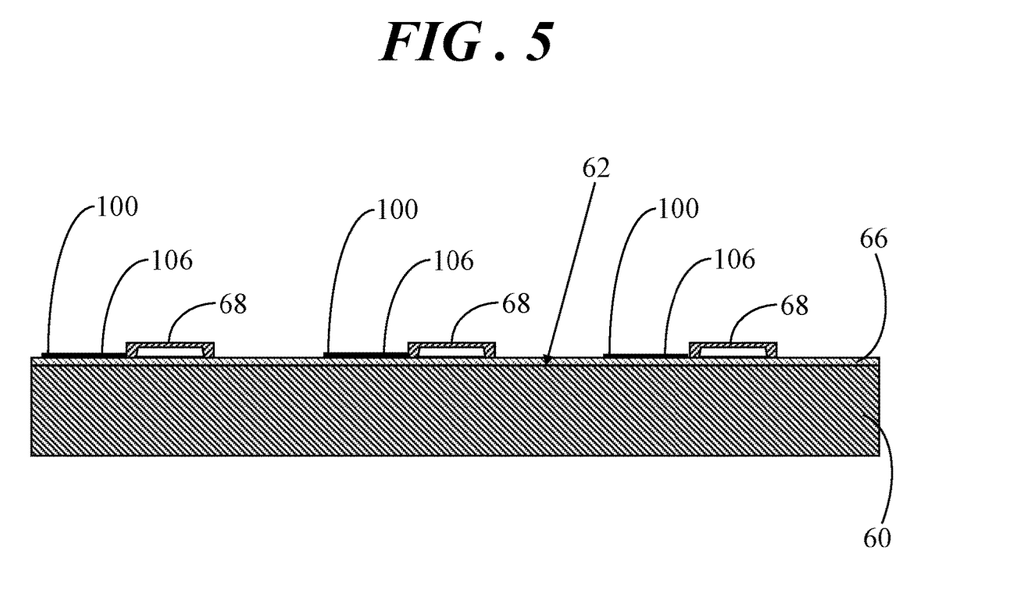
FIG. 5 shows a side view of a structure at an initial phase of manufacturing to produce either of the stress isolated sensor dies of FIGS. 2-4 for incorporation into a packaged device.

FIG. 5 shows a side view of a structure at an initial stage of a manufacturing process for forming a stress isolated sensor die (e.g., sensor die 52 or sensor die 108, FIGS. 2-4, or variants thereof) for incorporation into a device package (e.g., device package 50). At this initial stage, substrate 60, in the form of a wafer, is provided with a field oxide (e.g., isolation material 66) formed thereon. Sensors 68 (for example, pressure sensors), first bond pads 100, and electrically conductive traces 106 have been previous manufactured at first surface 62 of substrate 60 on isolation material 66. Thus, FIG. 5 demonstrates a portion of a pressure sensor (Pcell) wafer near the end of a typical microelectromechanical systems (MEMS) process flow. Only three sensors 68 are shown in FIG. 5 and subsequent figures for simplicity of illustration. Those skilled in the art will recognize that a Pcell wafer is likely to contain a multiplicity of sensor 68.

Figure 6:
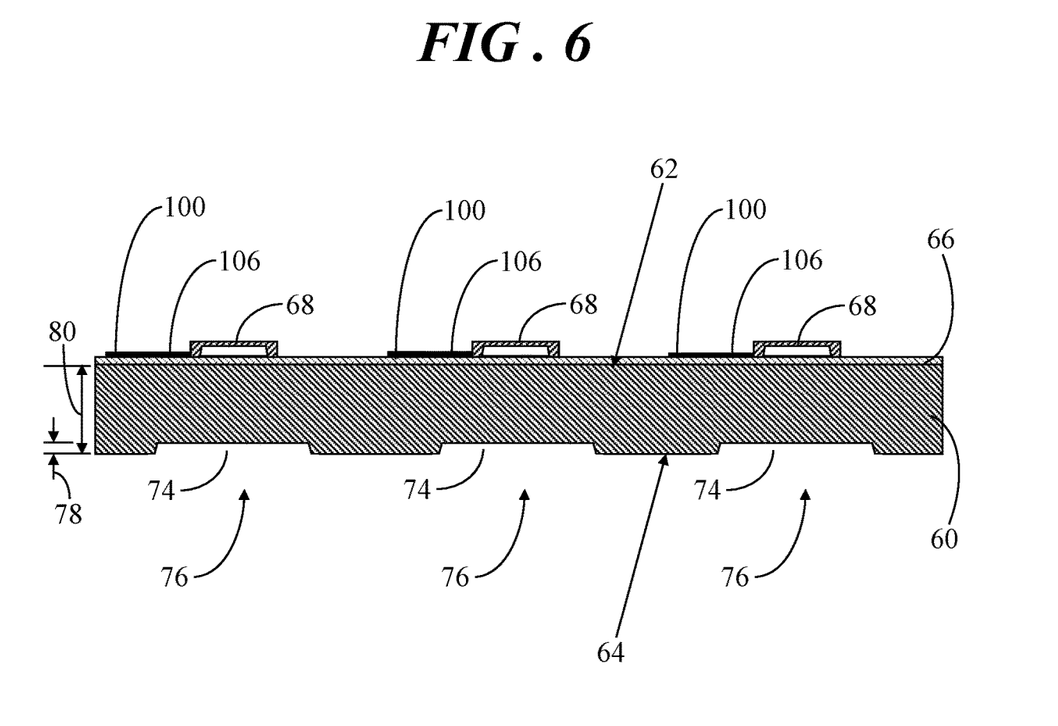
FIG. 6 shows a side view of the structure of FIG. 5 at a subsequent phase of manufacturing.

FIG. 6 shows a side view of the structure of FIG. 5 at a subsequent stage of manufacturing. Backside cavities 74 extend into substrate 60 from second surface 64 and are formed at locations 76 aligned with sensor regions 70 (FIG. 2). Substrate 60 may be etched using known techniques to form backside cavities 74. In particular, backside cavities are etched from second surface 64 into substrate 60 to depth 78 that is less than thickness 80 of substrate 60.

Figure 7:
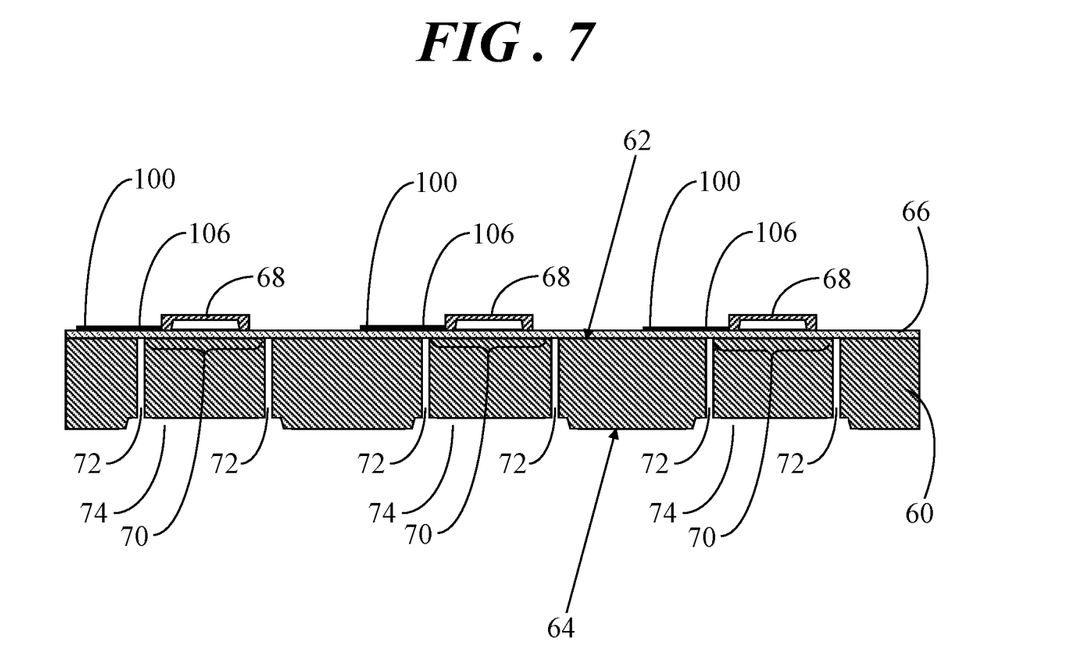
FIG. 7 shows a side view of the structure of FIG. 6 at a subsequent phase of manufacturing to produce the sensor die of FIG. 3.

FIG. 7 shows a side view of the structure of FIG. 6 at a subsequent stage of manufacturing to produce sensor die 52 (FIG. 3). Trenches 72 are formed extending entirely through substrate 60 in which trenches 72 extend between first and second surfaces 62, 64 of substrate 60. In the example of FIG. 7 corresponding with the structure of FIG. 3, each trench 72 entirely surrounds each sensor region 70 at which sensor 68 is formed. Trenches 72 may be etched entirely through substrate 60 using any known deep trench formation technique. By way of example, a mask (not shown) may be used to cover or otherwise protect those regions of second surface 64 that are not to be etched. As such, the mask provides a pattern for forming trenches 72 from second surface 64 through substrate 60 in which the etching stops at isolation material 66. Note that conductive traces 106 were previously formed on isolation material 66 and therefore now extend across trenches 72 in order to interconnect sensor 68 with first bond pads 100.

FIG. 8 shows a side view of the structure of FIG. 6 at a subsequent stage of manufacturing to produce sensor die 108 (FIG. 4). Trenches 110 are formed extending entirely through substrate 60 and through isolation material 66. In the example of FIG. 8 corresponding with the structure of FIG. 4, each trench 110 partially surrounds each sensor region 70 at which sensor 68 is formed to form cantilevered platform structures 112 (FIG. 4). Trenches 110 may be etched through substrate 60 and isolation material 66 using any known deep trench formation technique and/or multiple etching processes. Note that conductive traces 106 were previously formed on isolation material 66 and are suitably routed so that they reside on arms 116 of cantilevered platform structure 112 (as discussed above in connection with FIG. 4) in order to interconnect pressure sensor 68 with first bond pads 100.

As further shown in FIG. 8, isolation material 122 (e.g., a polyimide material) has been formed extending across trenches 110. Isolation material 66 extending across isolation trenches 72 and isolation material 122 extending across trenches 110 effectively protect trenches 72, 110 during manufacturing. That is, contaminants, such as saw slurry, cannot enter trenches 72, 110 during manufacturing. Further, the presence of isolation material 66 and or 122 enables the implementation of conventional photoresist/photoresist removal at assembly. Still further, by sealing trenches 72 using isolation material 66 or by sealing trenches 110 using isolation material 122, the structures of FIGS. 7 and 8 are compatible with existing tools and processes that utilize a standard vacuum chuck. It should be noted that FIGS. 6-8 demonstrate methodology in which backside cavities 74 are formed prior to trenches 72 or 110. However, trenches 72 or 110 may be formed prior to backside cavities 74 in alternative processes.

Figure 9:
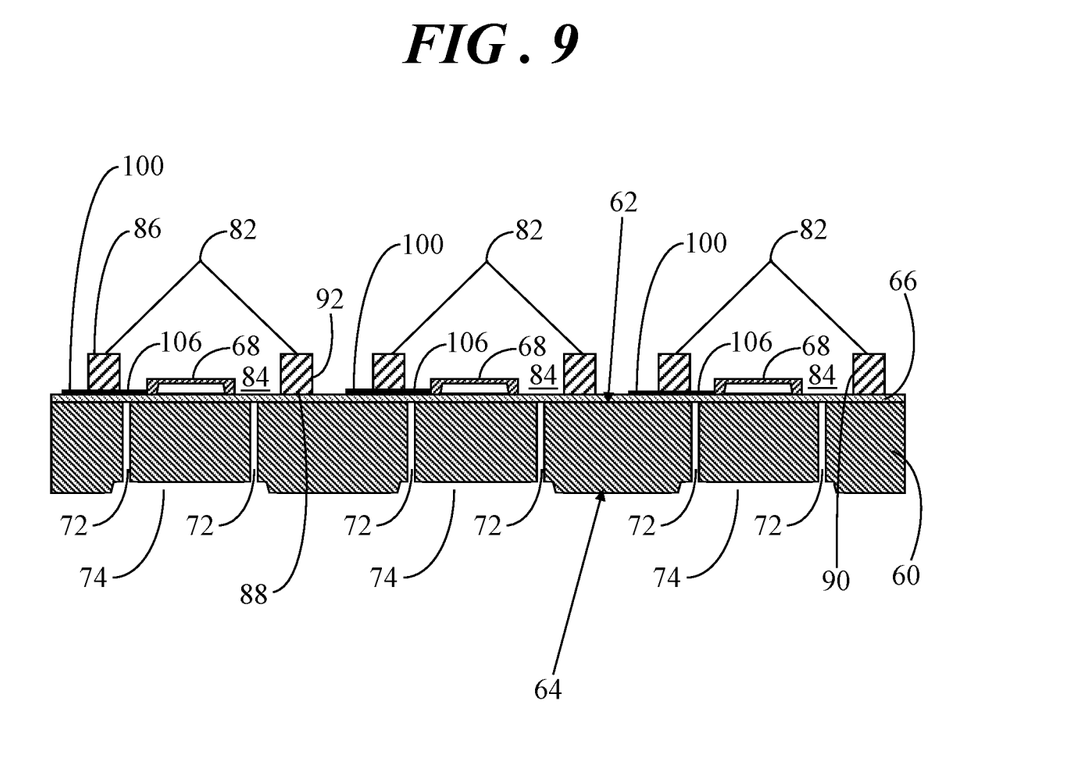
FIG. 9 shows a side view of the structure of FIG. 7 at a subsequent phase of manufacturing.

FIG. 9 shows a side view of the structure of FIG. 7 at a subsequent stage of manufacturing. Subsequent manufacturing operations will be described in connection with the assembly of packaged device 50 (FIG. 2) using sensor die 52 (FIG. 3) for simplicity. However, these subsequent manufacturing operations apply equivalently to the manufacture of packaged device 50 built with sensor die 108 (FIG. 4). As shown in FIG. 9, ring structures 82 are formed at first surface 62 of substrate 60. More particularly, ring structures 82 are formed on isolation material 66 at first surface 62 of substrate 60. Ring structures 82 may be thick-film, flexible, conductive or non-conductive polymer rings. Ring structures 82 may be square-shaped, circular-shaped, or any other suitable shape.

Each ring structure 82 is formed to include first and second oppositely facing ring structure surfaces 86, 88 with inner and outer walls 90, 92 extending between first and second surfaces 86, 88. In this example, second surface 88 of ring structure 82 is coupled to first surface 62 of substrate 60 by way of isolation material 66. Inner wall 90 creates first cavity 84 for sensor 68. Ring structures 82 may be formed over electrically conductive traces 106 but not over first bond pads 100. That is, each ring structure 82 encircles sensor 68 and a corresponding trench 72. However, first bond pads 100 are located outside of outer wall 92 of ring structure 82 and are therefore exposed for later wire bonding activities.

In some embodiments, ring structures 82 can be created by applying a thick and flexible film of polymer (e.g., polytetrafluoroethylene, perfluoroalkoxy, and so forth) to isolation material 66 on substrate 60, making a bond between the thick film polymer and the features (e.g., isolation material 66 and/or electrically conductive traces 106) on substrate 60. In an embodiment, the bond can be created by heating the combination. Once the polymer film is bonded to isolation material 66, ring structures 82 can be formed by imaging holes in the polymer film using known photolithography technique, followed by a chemical or dry etch removal of portions of the thick film. Alternatively, a sheet of thick film polymer ring structures 82 can be formed prior to attachment of the sheet to a structure that includes isolation material 66, sensors 68, and electrically conductive traces 106 using standard manufacturing techniques. Assuming proper alignment between the sheet of preformed ring structures 82 and isolation material 66, a bond is created between ring structures 82 and isolation material 66. This bond can be created by heating ring structures 82 and isolation material 66 in an embodiment.

Polymer ring structures 82 will remain flexible after heating, and will be flexible enough at mold temperature (e.g., approximately 175° C.) to maintain a seal with a mold during a subsequent encapsulation process more fully described in connection with FIG. 12. Ultimately, ring structures 82 are used during package encapsulation to create an encapsulation cavity (e.g., first cavity 84) for sensor 68. Importantly, use of a flexible polymer ring structure 82 eliminates the use of expensive film during package molding and ring structure 82 creates seals between ring structure 82 and a mold (discussed below) and between ring structure 82 and isolation material 66 on substrate 60 that prevents mold compound from flowing into first cavity 84.

Figure 10:
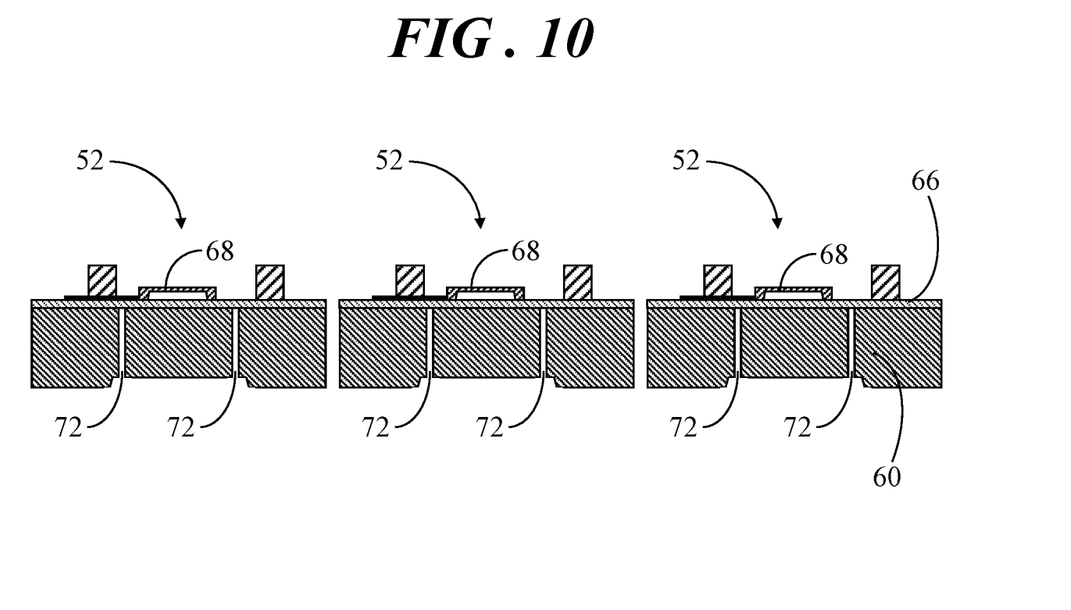
FIG. 10 shows a side view of the structure of FIG. 9 at a subsequent phase of manufacturing.

FIG. 10 shows a side view of the structure of FIG. 9 at a subsequent stage of manufacturing. Substrate 60 is diced to yield individual sensor dies 52 having stress isolated individual or groups of sensors 68. The presence of isolation material 66 extending across trenches 72 (or isolation material 122 extending across trenches 110, FIG. 8) prevents debris from entering trenches 72 (110) during the dicing process.

Figure 11:
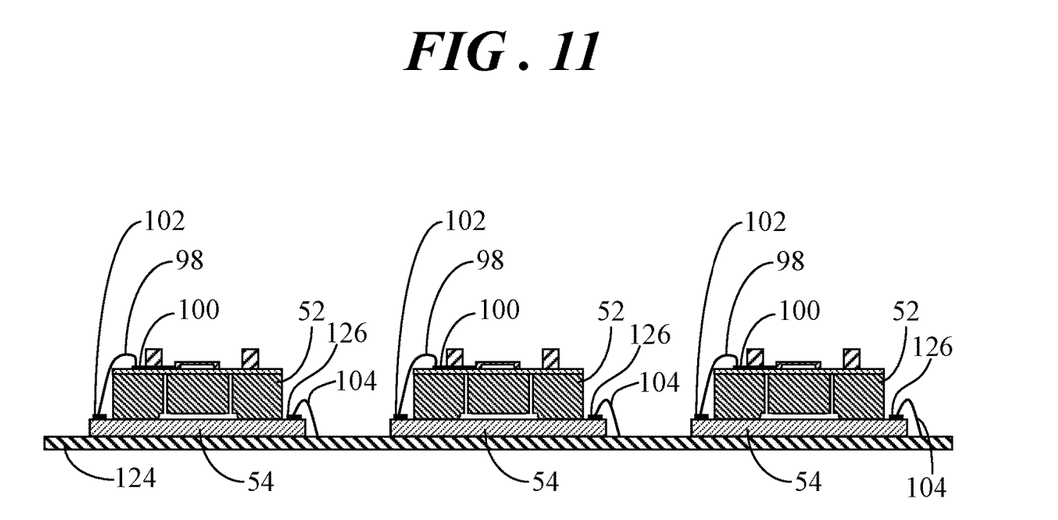
FIG. 11 shows a side view of the structure of FIG. 10 at a subsequent phase of manufacturing.

FIG. 11 shows a side view of the structure of FIG. 10 at a subsequent stage of manufacturing. More particularly, FIG. 11 shows sensor dies 52 after they are mounted on ASIC dies 54, which in turn are mounted on a lead frame structure 124. First bond wires 98 are connected to first bond pads 100 on sensor dies 52 and to second bond pads 102 on ASIC dies 54. Additionally, bond wires 104 are suitably interconnected between additional bond pads 126 on ASIC dies 54 and to suitable locations (e.g., bond pads) on lead frame structure 124.

Figure 12:
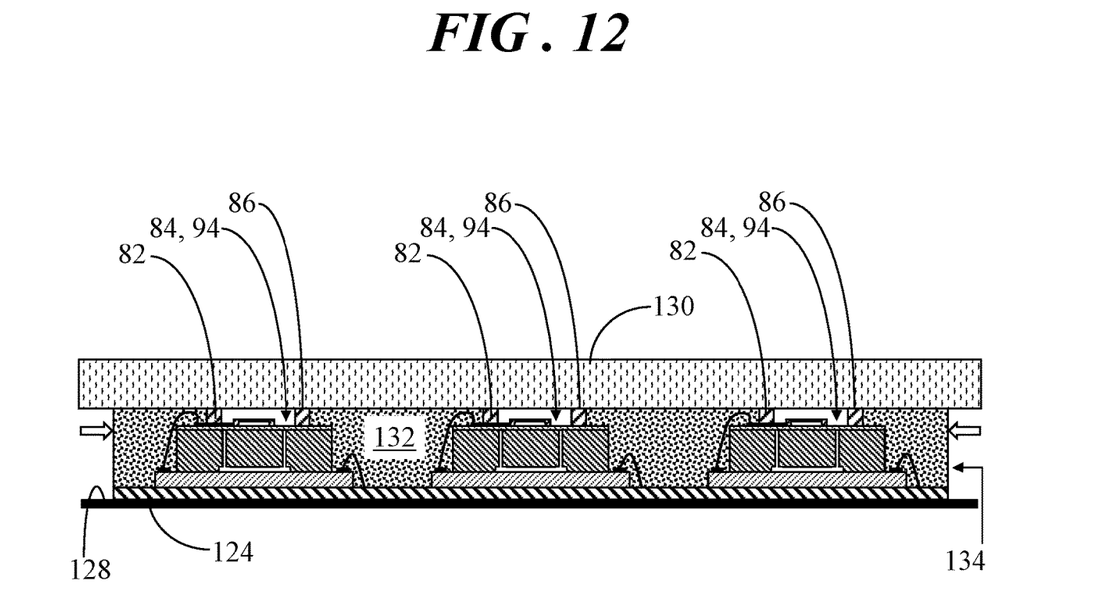
FIG. 12 shows a side view of the structure of FIG. 11 at a subsequent phase of manufacturing.

FIG. 12 shows a side view of the structure of FIG. 11 at a subsequent stage of manufacturing. More particularly, FIG. 12 illustrates the structure of FIG. 11 during a stage of one type of encapsulation process to create molded compound body 58 (FIG. 2). In particular, leadframe structure 124 rests on a surface 128 of a machine that includes a mold 130 that contacts first flat surfaces 86 of ring structures 82 while an encapsulation mold compound 132 (e.g., molten epoxy mold compound) flows into a mold cavity 134 of mold 130. Mold 130 contacts first flat surfaces 86 of ring structures 82 to create a seal that prevents encapsulation mold compound 132 from flowing into cavities 84 that are created by ring structure 82. Mold compound 132 is subsequently cured to create a hardened molded compound body 58 around ring structures 82.

Molded compound body 58 (FIG. 2) is formed at least partially around the structure shown in FIG. 11 so that a molded body cavity (e.g., second cavity 94) is produced that is concentric with first cavity 84. Molded compound body 58 encapsulates bond pads 98, 102, 124 as well as bond wires 100, 104. Molded compound body 58 may sufficiently protect components, including bond wires 100, so that a gel fill (e.g., gel material 95) may not be needed.

Figure 13:
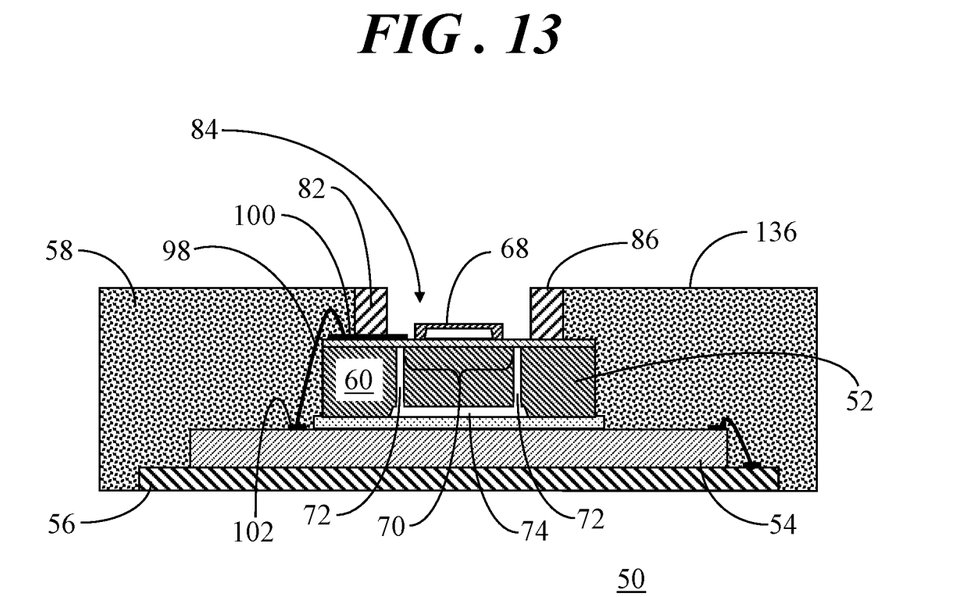
FIG. 13 shows a side sectional view of the MEMS packaged device of FIG. 2 at a subsequent phase of manufacturing.
Figure 14:
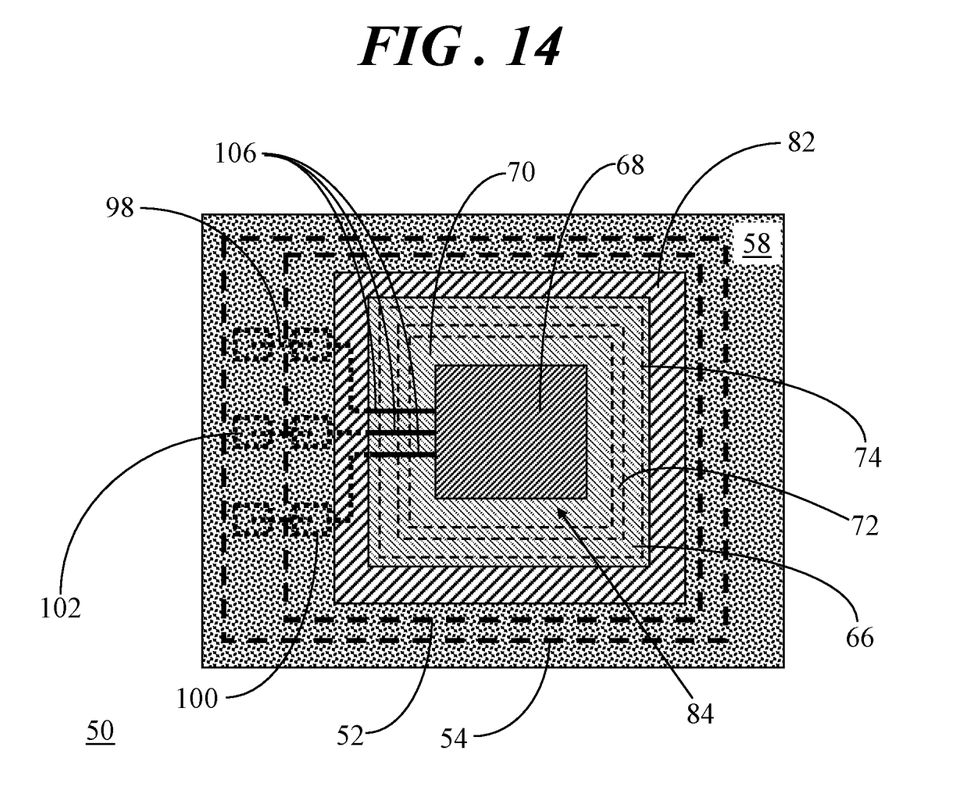
FIG. 14 shows a top view of the MEMS packaged device at the subsequent phase of manufacturing of FIG. 13.

Referring to FIGS. 13 and 14, FIG. 13 shows a side sectional view of MEMS packaged device 50 at a subsequent phase of manufacturing and FIG. 14 shows a top view of MEMS packaged device 50 at the subsequent phase of manufacturing of FIG. 13. After the encapsulation process, the structure of FIG. 12 is singulated to produce multiple MEMS packaged devices 50 (one shown), each of which includes lead frame 56, ASIC die 54, and sensor die 52. As can be seen in FIG. 13, a top surface 136 of molded body 58 is flush or substantially flush with first flat surface 86 of ring structure 82. Additionally, cavity 84 is preserved by virtue of ring structure 82 during the encapsulation process. In this configuration, sensor 68 (e.g., a pressure sensor) is in fluid communication with its environment via cavity 84. However, bond wires 98 interconnected between first and second bond pads are effectively encapsulated in molded compound body 58, thereby reducing the potential for changes to bond wire parasitic capacitance.

In FIG. 14, a portion of sensor die 52, and particularly sensor region 70 and sensor 68 are visible through first cavity 84. However, ASIC die 54, bond wires 98, and first and second bond pads 100, 102 are encapsulated by molded compound body 58. ASIC die 54 and an outer perimeter of sensor die 52 are represented by dashed line boxes to demonstrate their relationship to one another. Additionally, bond wires 98 and first and second bond pads 100, 102 are represented by dotted lines to demonstrate the interconnections between sensor die 52 and ASIC die 54, and to highlight the encapsulation of bond wires 98 and first and second bond pads 100, 102 in molded compound body 58. Lead frame 56 and its interconnection with ASIC die 54 are not delineated for simplicity.

Sensor 68 is substantially isolated from lateral package stresses due to the presence of trench 72 extending through substrate 60 surrounding sensor region 70 of sensor die 52. Additionally, backside cavity 74 provides clearance between sensor region 70 of sensor die 52 and the underlying ASIC die 54 or die-attach material to ensure vertical stress isolation. In this example, gel material 95 (FIG. 2) has not been dispensed in cavity 84. However, gel material 95 may be dispensed in cavity 84 in some embodiments as shown in FIG. 2.

Embodiments described herein entail MEMS packaged devices and methodology for manufacturing such packaged devices. More particularly, stress isolation is built into a MEMS die to enable smaller packages and a more standard packaging methodology. The stress isolation is achieved by a trench built into a MEMS sensor die (such as a pressure sensor die) and surrounding a sensor region of the die that isolates a sensor at the sensor region from lateral package stress. Additionally, a shallow backside cavity provides clearance between the sensor region and an attached application specific integrated circuit (ASIC) to ensure vertical stress isolation. A standoff (referred to herein as a ring structure) surrounds the trench and the sensor region to allow a mold tool to seal directly to the top of the MEMS die to enable an overmolded package. The overmolded package provides for encapsulation of the bond wires to reduce the potential for changes in bond wire parasitic capacitance. For some applications, a no-gel sensor configuration is possible or a soft gel can be used for media compatibility, thereby enabling a wide application range. Still further, the manufacturing methodology may enable means for integrating sensor devices, such as pressure sensors, into fanout wafer level chip scale packages (WLCSPs). The manufacturing methodology may therefore result in reduced cost, reduced size of the packaged devices, improved reliability and accuracy of the packaged devices, and provide a pathway to ongoing technology enhancements.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A package comprising:
a die that includes a substrate having a first surface and a second surface, a sensor formed at a sensor region of the first surface, and a hollow trench extending entirely through the substrate between the first and second surfaces, the trench having at vertical opening at least partially surrounding the sensor region at the first surface that separates the sensor region from a remaining portion of the first surface surrounding the sensor region;
an isolation material formed on the first surface and extending over the vertical opening of the trench between the sensor region and the remaining portion of the first surface; and
a ring structure coupled to the remaining portion of first surface of the substrate to create a first cavity in which the sensor is contained, the ring structure being laterally displaced away from and surrounding the sensor region and the trench above the remaining portion of the first surface;
wherein the package further comprises a gel material disposed in the first cavity that covers the sensor and is prevented from entering the trench by the isolation material.

2. The package of claim 1 wherein the isolation material comprises at least one of an oxide, a polysilicon, a nitride, and a polyimide material extending over the trench.

3. The package of claim 1 wherein the substrate includes a backside cavity extending into the substrate from the second surface at a location that is aligned with the trench and the sensor region, the backside cavity having a depth that is less than a thickness of the substrate between the first and second surfaces.

4. The package of claim 1 wherein the trench surrounds the sensor region to form a cantilevered platform structure having a platform and an arm having first and second ends, the first end extending from the platform and the second end extending from the substrate bordering the trench, the sensor being formed on the platform, wherein the ring structure extends across the second end of the arm.

5. The package of claim 1 further comprising a molded compound body comprising a second cavity that is concentric with the first cavity to enable fluid communication between the sensor and an environment external to the package.

6. The package of claim 5 wherein:
the ring structure includes an inner wall and an outer wall extending between first and second oppositely facing ring structure surfaces, the second ring structure surface being coupled to the first surface of the substrate, the inner wall circumscribing the trench and the sensor region, and the molded compound body abutting the outer wall.

7. The package of claim 5 wherein a seal is formed between the second ring structure surface and the substrate, the seal inhibiting flow of a molding compound into the first cavity during an encapsulation process in which the molded compound body is formed.

8. The package of claim 5 wherein the die is a first die, and the package further comprises:
a second die coupled to the second surface of the first die; and
a bond wire interconnected between a first bond pad on the first die and a second bond pad on the second die, the first bond pad being located at the first surface of the first die outside of an outer periphery of the ring structure, wherein the molded compound body encapsulates the bond wire.

9. The package of claim 1 wherein the sensor is a pressure sensor.

10. A method of forming a packaged device comprising:
forming a trench extending entirely through a substrate of a first die, the trench extending between first and second surface of the substrate, the trench having a vertical opening at least partially surrounding a sensor region of the first die at the first surface that separates the sensor region from a remaining portion of the first surface surrounding the sensor region, wherein a sensor is formed at the first surface of the substrate at the sensor region;
applying an isolation material on the first surface and extending over the vertical opening of the trench;
forming a ring structure above the remaining portion of the first surface of the substrate to create a first cavity in which the sensor is contained, the ring structure being laterally displaced away from and surrounding the sensor region and the trench above the remaining portion of the first surface; and
disposing a gel material that covers the sensor in the first cavity and is prevented from entering the trench by the isolation material.

11. The method of claim 10 further comprising forming a backside cavity extending into the substrate from the second surface at a location that is aligned with the trench and the sensor region, the backside cavity having a depth that is less than a thickness of the substrate between the first and second surfaces.

12. The method of claim 10 further comprising:
contacting the ring structure with a mold to create a seal between the mold and the ring structure; and
encapsulating a portion of the first die with a molding compound while the polymer ring contacts the mold to form a molded compound body having a second cavity that is concentric with the first body to enable fluid communication between the sensor and an environment external to the packaged device.

13. The method of claim 12 wherein prior to the contacting and encapsulating operations, the method further comprises:
coupling a second die to the second surface of the first die;
interconnecting a bond wire between a first bond pad on the first die and a second bond pad on the second die, the first bond pad being located on the first surface of the first die outside of an outer periphery of the ring structure; and the encapsulating operation further comprises encapsulating the bond wire.

14. A package comprising:
a die that includes a substrate having a first surface and a second surface, a pressure sensor formed at a sensor region of the first surface, a trench extending entirely through the substrate between the first and second surfaces, the trench having a vertical opening at the first surface that separates the sensor region from a remaining portion of the first surface surrounding the sensor region at least partially surrounding the sensor region, and a backside cavity extending into the substrate from the second surface at a location that is aligned with the trench and the sensor region, the backside cavity having a depth that is less than a thickness of the substrate between the first and second surfaces;
an isolation material formed on the first surface and extending over the vertical opening of the trench;
a ring structure coupled to the remaining portion of the first surface of the substrate to create a first cavity in which the sensor is contained, the ring structure being laterally displaced away from and surrounding the sensor region and the trench above the remaining portion of the first surface;
a molded compound body comprising a second cavity that is concentric with the first cavity to enable fluid communication between the pressure sensor and an environment external to the package; and
a gel material disposed in the first cavity that covers the sensor and is prevented from entering the trench by the isolation material.

15. The package of claim 14 wherein the ring structure includes an inner wall and an outer wall extending between first and second oppositely facing ring structure surfaces, the second ring structure surface being coupled to the first surface, the inner wall circumscribing the trench and the sensor region, and the molded compound body abutting the outer wall.

16. The package of claim 14 wherein the die is a first die, and the package further comprises:
a second die coupled to the second surface of the first die; and
a bond wire interconnected between a first bond pad on the first die and a second bond pad on the second die, the first bond pad being located on the first surface of the first die outside of an outer periphery of the ring structure, wherein the molded compound body encapsulates the bond wire.

* * * * *